United States Patent [19]
Lakshmikumar

[11] Patent Number: 5,565,817
[45] Date of Patent: Oct. 15, 1996

[54] RING OSCILLATOR HAVING ACCELERATED CHARGING AND DISCHARGING OF CAPACITORS

[75] Inventor: Kadaba R. Lakshmikumar, Wescosville, Pa.

[73] Assignee: Lucent Technologies Inc., Murray Hill, N.J.

[21] Appl. No.: 509,073

[22] Filed: Jul. 31, 1995

[51] Int. Cl.$^6$ .............................. H03B 5/24; H03H 11/26
[52] U.S. Cl. ........................... 331/57; 327/237; 327/251; 327/288
[58] Field of Search .............................. 331/57; 327/237, 327/246, 247, 250, 251, 252, 253, 280, 281, 287, 288, 290

[56] References Cited

U.S. PATENT DOCUMENTS

| | | | |
|---|---|---|---|
| 5,059,924 | 10/1991 | JenningsCheck | 331/57 |
| 5,298,870 | 3/1994 | Cytera et al. | 331/57 |
| 5,365,204 | 11/1994 | Angiulli et al. | 331/57 |
| 5,416,446 | 5/1995 | Holler, Jr. et al. | 331/57 |
| 5,479,129 | 12/1995 | Fernandez et al. | 327/276 |

OTHER PUBLICATIONS

A Variable Delay Line PLL for CPU–Coprocessor Synchronization By: Mark G. Johnson and Edwin Hudson, IEEE Journal of Solid–State Circuits, vol. 23, Oct. 1988.

A High–Frequency Integrated CMOS Phase–Locked Loop By: Kurt Matthew Ware, Jun. 1989 Thesis submitted at Massachusetts Institute of Technology.

*Primary Examiner*—Siegfried H. Grimm

[57] ABSTRACT

In a ring oscillator, a delay unit includes an input stage having a first and a second input port and a first and a second differential output port. At least two delay units are coupled together so as to form the ring oscillator. The delay unit further includes a first capacitor coupled to the first differential output port of each one of the delay units and a second capacitor is coupled to the second differential output port of the delay unit. A switching accelerator is coupled to the first and second capacitors so as to reduce the time it takes to switch between charged and discharged states for the capacitors. In accordance with another aspect of the invention, a method for providing a delay in a delay unit, the delay of the delay unit being dependent, at least in part, upon the time to charge and discharge a capacitor coupled in the delay unit, the method including the steps of: providing a current signal to the delay unit in a manner so as to cause the capacitor to enter a charged state from a prior discharged state; and accelerating the switching between the discharged and charged states so as to reduce the time it takes to switch between the discharged and charged states for the capacitor.

19 Claims, 6 Drawing Sheets

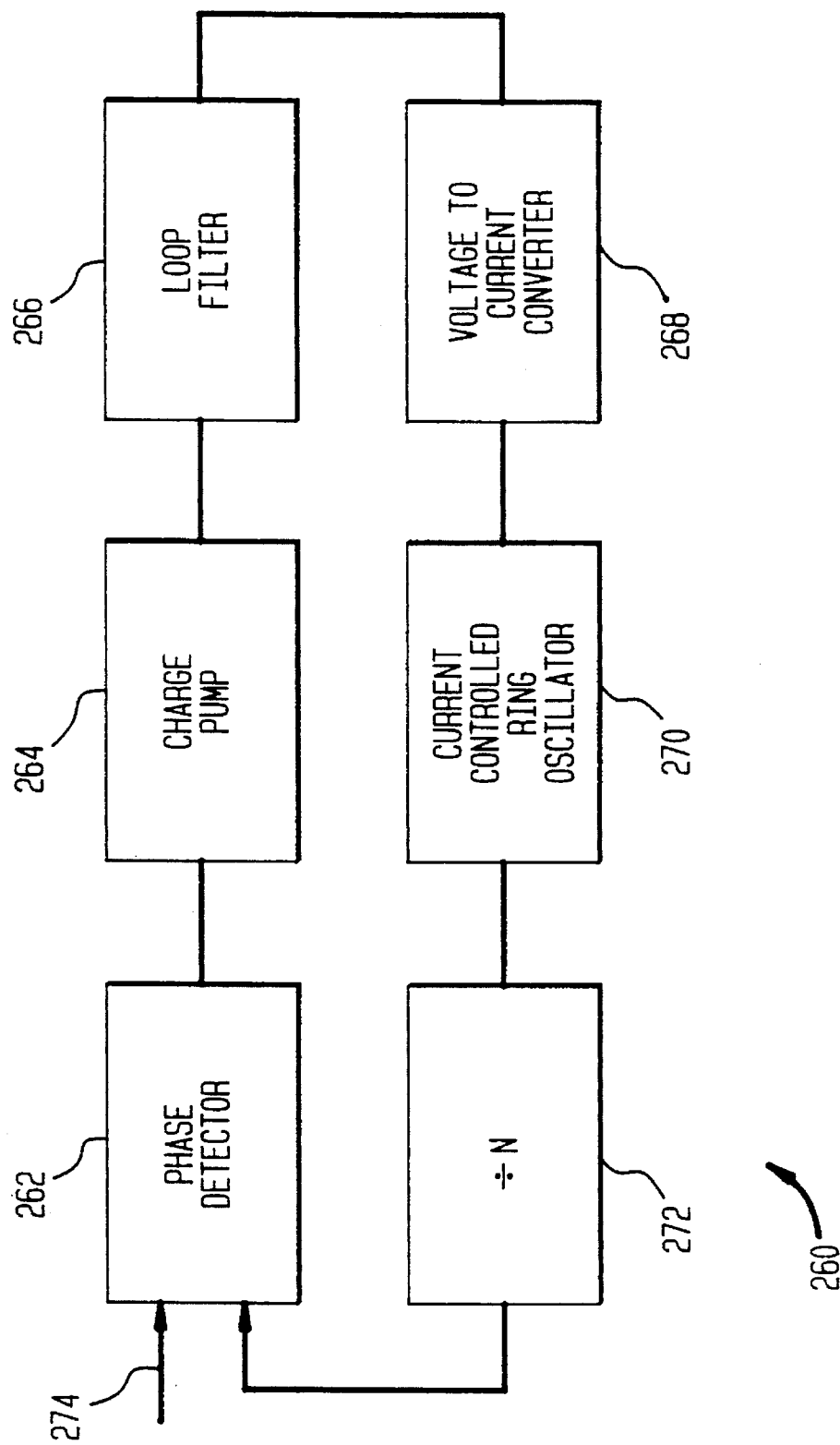

RING OSCILLATOR HAVING ACCELERATED CHARGING AND DISCHARGING OF CAPACITORS

RELATED APPLICATIONS

This patent application is related to concurrently filed patent application Ser. No. 08/509,563, entitled "MPSK DEMODULATOR," (Dwarakanath 6-4-1-13-1) by M. R. Dwarakanath et.al, and incorporated herein by reference; concurrently filed patent application Ser. No. 08/509,072, entitled "VOLTAGE-TO-CURRENT CONVERTER," (Lakshmikumar 6) by K. Lakshmikumar, and incorporated herein by reference; and concurrently filed patent application Ser. No. 08/509,562, entitled "WIDE BAND CONSTANT GAIN AMPLIFIER," (Nagaraj 15) by K. Nagaraj, and incorporated herein by reference.

TECHNICAL FIELD

This invention relates to oscillators, and, specifically to, ring oscillators.

BACKGROUND OF THE INVENTION

Many electronic applications include an oscillator circuit that converts a substantially constant current or voltage input signal to a periodic output signal having a substantially predetermined frequency. Certain oscillator circuits, for example, provide a substantially sinusoidal signal. These circuits, typically, employ a tuned element such as a crystal oscillator that generates a sinusoidal frequency in response to a voltage signal. Other oscillator circuits, such as ring oscillators, provide digital pulse signals having a substantially predetermined frequency. In certain applications, it is desired to vary the frequency of the output signal of an oscillator as a function of a control signal. For example, phase-locked loops (PLL's) include an oscillator that generates an output signal with a frequency, capable of being varied substantially in accordance with a control signal. In many instances, the frequency of this oscillator may be varied over a certain frequency range by a control voltage or current signal. These types of oscillators are referred to in this context as voltage or current-controlled oscillators.

Conventional ring oscillators are nonlinear in frequency. As the input control current signal to these ring oscillators varies, the oscillation frequency of the circuit does not respond linearly. However, in some applications, it is desirable to have a ring oscillator that is substantially linear in frequency. Therefore, a need exists for a ring oscillator that has a substantially linear frequency/current characteristic.

SUMMARY OF THE INVENTION

Briefly, in accordance with one aspect of the present invention, in a ring oscillator a delay unit comprises: an input stage having a first and a second input port and a first and a second differential output port, at least two delay units being coupled together so as to form the ring oscillator; a first capacitor coupled to the first differential output port of each one of the delay units and a second capacitor coupled to the second differential output port of each one of the delay units; and a switching accelerator coupled to the first and second capacitors so as to reduce the time it takes to switch between charged and discharged states for said capacitors.

Briefly, in accordance with another aspect of the invention a method for providing a delay in a delay unit, the delay of the delay unit being dependent, at least in part, upon the time to charge and discharge a capacitor coupled in the delay unit, the method comprising the steps of: providing a current signal to the delay unit in a manner so as to cause the capacitor to enter a charged state from a prior discharged state; and accelerating the switching between said discharged and charged states so as to reduce the time it takes to switch between said discharged and charged states for said capacitor.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

FIG. 8 illustrates a phase-locked loop that may employ an embodiment of a ring oscillator in accordance with the present invention.

DETAILED DESCRIPTION OF THE INVENTION

Figure 1:
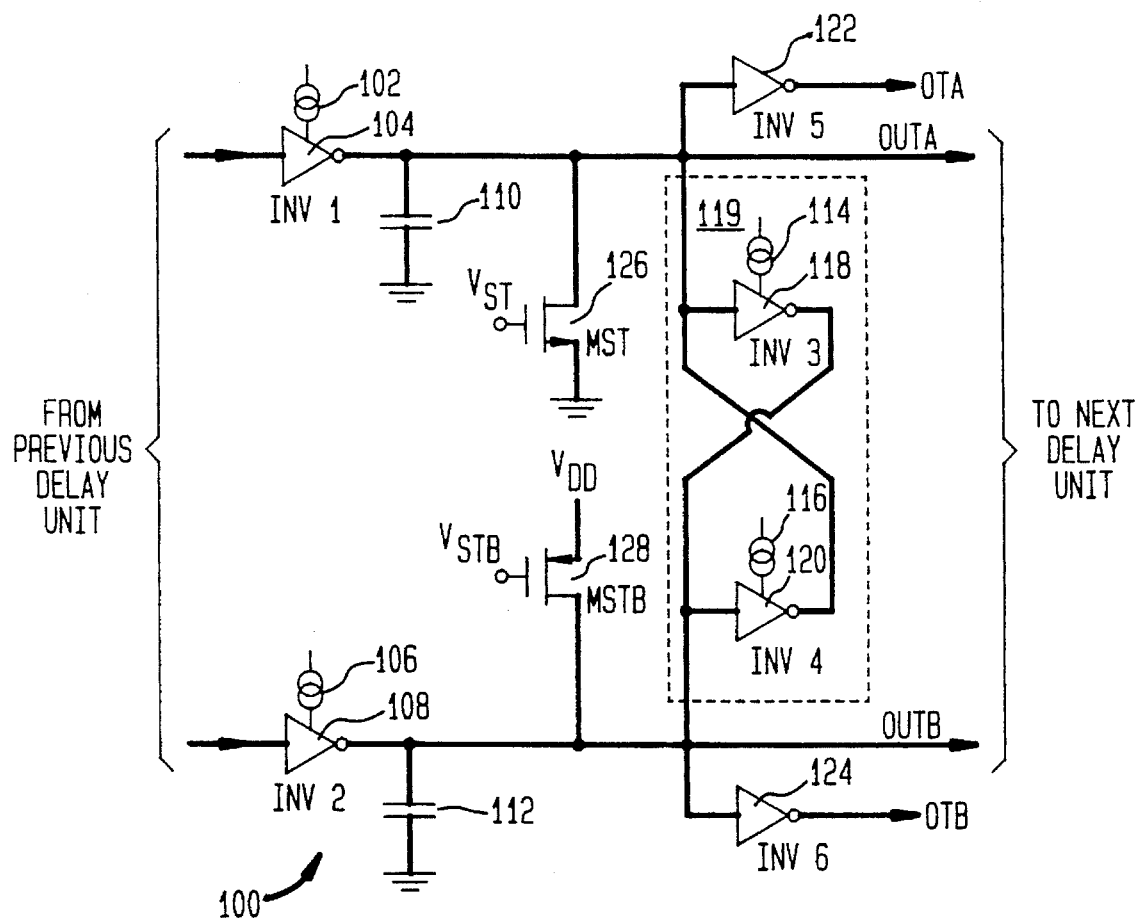
FIG. 1 illustrates a schematic diagram of an embodiment of a delay unit of a ring oscillator in accordance with the present invention.

In certain applications, it is desirable to generate a given or predetermined number of phase-shifted clock signals, having substantially the same frequency. For example, in concurrently filed patent application Ser. No. 08/509,563, incorporated by reference herein, entitled "MPSK DEMODULATOR" (Attorney Docket "Dwarakanath 6-4-1-13-1), by Dwarakanath et al., filed on Jul. 31, 1995, assigned to the same assignee of the present invention, a multiphase frequency generator comprises a phase-locked loop that is used to provide a predetermined number of phase shifted clock signals.

FIG. 8 illustrates a phase-locked loop 260 having a phase detector 262, a charge pump 264, a loop filter 266, a voltage-to-current converter 268, a current-controlled ring oscillator 270, and a frequency divider 272. Such a phase-locked loop may employ a ring oscillator in accordance with the present invention, although the invention is not restricted in scope to this particular application. In one application of the phase-locked loop, the phase detector receives a clock reference signal 274 as an input signal. Current-controlled ring oscillator 270 generates an output signal that has a frequency which is an approximate multiple of the frequency of the clock reference signal. It is desirable to use a ring oscillator that has a substantially linear frequency/current transfer characteristic, as described in more detail hereinafter. A phase-locked loop, that has a ring oscillator with such a linear frequency/current characteristic, exhibits a dynamic behavior that is substantially independent of process and temperature variations, as will be explained in more detail hereinafter, with reference to FIGS. 5 and 7. With a linear frequency/current characteristic, the phase-locked loop may remain in a stable condition over a wide range of clock reference input signals 274. This follows because, as the frequency of clock reference input signal varies, the control current signal, generated by voltage-to-current converter, and coupled to ring oscillator 270, also varies. However, because ring oscillator 270 has a linear frequency/current characteristic, the frequency of output signal of ring oscillator 270 responds linearly.

Figure 3:
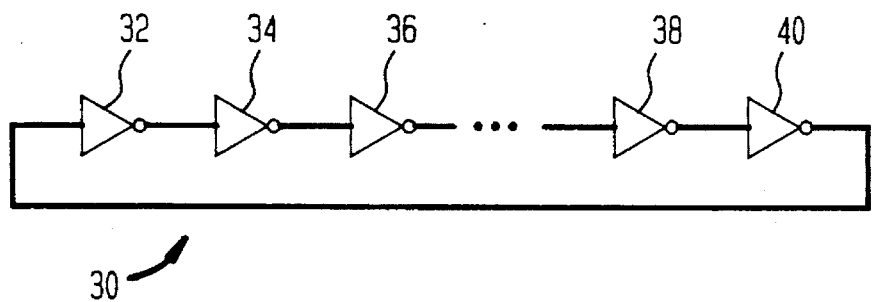
FIG. 3 illustrates a schematic diagram of a prior art ring oscillator.

One approach to generate multiple phase shifted clock signals is to use a ring oscillator 30 as shown in FIG. 3. Ring oscillator 30 comprises an odd number of inverting gain stages, such as inverters or delay elements 32, 34, 36, 38 and 40. The period of oscillation of ring oscillator 30 approximates, $2Nt_d$, where N is the number of the inverting gain stages, and $t_d$ is the approximate propagation delay of each element. The output signal of each inverter may be used as a clock signal. The N output signals, provided by the ring oscillator, provide N different phases as desired. One problem with the oscillator circuit of FIG. 3 is that it does not have a substantially linear frequency/current characteristic. Furthermore, if it is desired to have an even number of phase-shifted clock signals, this oscillator circuit may not be appropriate. This follows because, in order to maintain oscillation, it is desirable that at least one delay element in the ring oscillator generate an output signal that is 180 degrees out of phase with the phase of the input signal of a next delay element. This phase relation may be accomplished when there is an odd number of delay elements in the ring.

Figure 4:
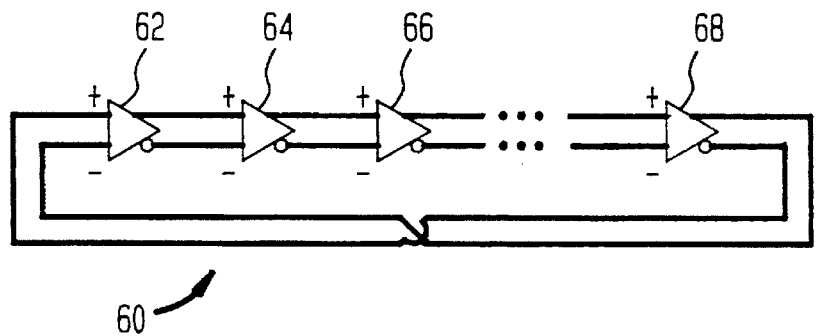
FIG. 4 illustrates a schematic diagram of a prior art differential input ring oscillator.

In order to generate an even number of phase-shifted clock signals, a differential ring oscillator 60, such as illustrated in FIG. 4, may be used. Oscillator 60 comprises an even number of inverting gain stages, such as differential inverters 62, 64, 66, and 68, that are adapted to receive and transmit both inverted and noninverted input and output signals. The output signal of the last stage, i.e. inverter 68, is reversed and coupled back to the input ports of the first stage, i.e. inverter 62, so as to maintain oscillation at each inverting gain stage. Oscillator 60 has substantially the same period, $2Nt_d$, as oscillator 30, but offers 2N different phases. Likewise, the frequency of oscillation of both oscillators 30 and 60 may be controlled, at least in part, by controlling the bias current signal provided at each delay element. However, the frequency/current characteristic of oscillator 60 is not linear.

Figure 2:
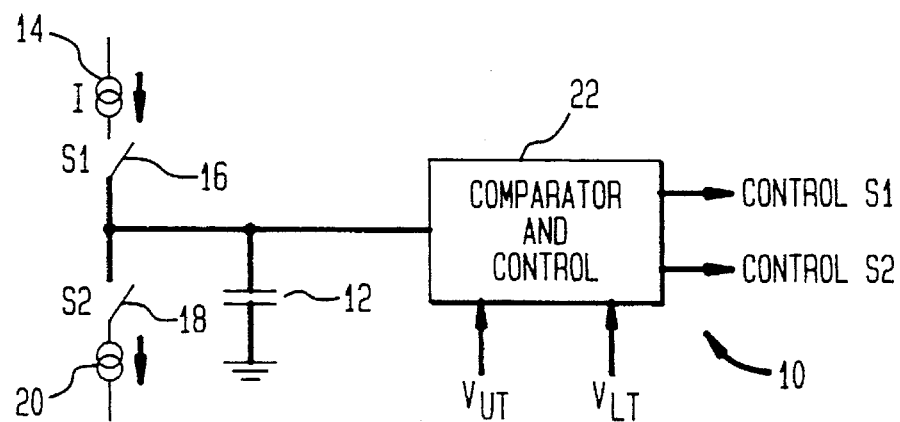
FIG. 2 illustrates a schematic diagram of a prior art multivibrator circuit.

In contrast a multivibrator exhibits a substantially linear frequency/current characteristic. FIG. 2 illustrates a conceptual schematic of a conventional multivibrator 10. This type of multivibrator is well-known and described in *Microelectronics, Digital and Analog Circuits and Systems*, by Jacob Millman (McGraw Hill, 1979) and incorporated herein by reference. Switches 16 and 18 may affect the flow of current to and from a timing capacitor 12. Timing capacitor 12 is coupled to a comparator and control circuit 22. Comparator and control circuit 22 receives two reference voltage signals, $V_{UT}$ and $V_{LT}$, respectively. The comparator and control circuit also controls the opening and closing of switches 16 and 18, although coupling to accomplish this switching is not explicitly illustrated. When switch 16 is closed, and switch 18 is open, timing capacitor 12 begins to charge until it reaches an upper threshold voltage signal, $V_{UT}$. Upon reaching this threshold, the control circuitry opens switch 16 and closes switch 18, so that timing capacitor 12 begins to discharge. Discharging continues until the capacitor voltage falls below a lower threshold voltage, $V_{LT}$, at which time the cycle repeats. The frequency of oscillation of the multivibrator depends, at least in part, on the time taken by capacitor 12 to charge from $V_{LT}$ to $V_{UT}$ and discharge from $V_{UT}$ to $V_{LT}$. The frequency of oscillation also depends, at least in part, on the delay time associated with the operation of comparator and switching circuit 22. The nonlinear characteristic of the oscillator is mostly attributable to the delay time associated with the operation of comparator and switching circuit 22. Thus, if the delay introduced by the comparator and switching circuits is reduced, the frequency of oscillation may at least approximate a linear function of the charging and discharging current. However, a multivibrator circuit as represented and explained with reference to FIG. 2, is not capable of providing a number of signals having substantially the same frequency but different phases.

FIG. 1 is a schematic diagram of an embodiment of a delay unit 100 that may be used in a ring oscillator in accordance with the present invention, although this invention is not limited in scope to the embodiment represented in FIG. 1. Delay unit 100 has an input stage formed by inverters 104 and 108. In a ring oscillator configuration, for example, each inverter 104 and 108 is coupled so as to receive a differential input signal from a prior delay unit. A current source or supply 102 provides a charging current signal to inverter 104 so as to provide a current signal for charging capacitor 110. Similarly, a current source 106 provides a charging current signal to inverter 108 so as to provide a current signal to charge capacitor 112. It will be appreciated that one of a number of embodiments of a current supply may be employed, such as a conventional MOSFET transistor operating in its saturation region or a Bipolar transistor operating in its active region. Furthermore, each inverter, as will be illustrated in more detail hereinafter, also includes a current source (FIG. 5) for providing a discharging path for capacitors 110 and 112. It will also be appreciated that a current sink that provides a discharging path for a capacitor is referred to in this context as a current source.

The output port of inverter 104 is coupled to one terminal of a capacitor 110, whose other terminal is grounded. Similarly, the output port of inverter 108 is coupled to one terminal of a capacitor 112, whose other terminal is also grounded. The output port of inverter 104 is also coupled to the first input port of a latch 119, which is formed of inverter 118 cross coupled to inverter 120. Of course, any latch will suffice, and the invention is not limited in scope to this particular latch. The output port of inverter 108 is also coupled to the second input port of latch 119. The output port of inverter 118 is coupled to the input port of inverter 120. Similarly, the output port of inverter 120 is coupled to the input port of inverter 118. Inverters 118 and 120 are driven by bias current signals provided by current supplies 114 and 116 respectively. Furthermore, each inverter 118 and 120, as will be illustrated in more detail hereinafter with reference to FIG. 5, includes a current source for providing a current path from these inverters to ground. Again, the invention is not limited in scope to a particular current source embodiment. Inverters 104 and 108 are configured so as to be able to generate enough current to drive inverters 118 and 120, so as to alter the state of latch 119. This may be achieved by adapting the transistors that form inverters 104 and 108 to have a larger "aspect ratio" than the transistors that form inverters 118 and 120. The "aspect ratio" of a transistor is the ratio defined by the width over the length of the gate of the transistor.

The output port of inverter 104 is also coupled to a buffer inverter 122. Similarly, the output port of inverter 108 is coupled to a buffer inverter 124. Buffer inverters 122 and 124 are used to couple the delay unit to external circuitry. A transistor 126 is coupled to inverter 104, in a configuration such that the drain of the transistor is coupled to the output port of inverter 104 and the source of the transistor is grounded. The gate of transistor 126 is capable of being supplied by a supply signal, $V_{ST}$. Another transistor 128 is coupled to inverter 108, in a configuration such that the drain of the transistor is coupled to the output port of inverter 108, and the source of transistor 128 is coupled to a power supply voltage source signal, $V_{DD}$. The gate of transistor 128 is capable of being biased by a supply signal, $V_{STB}$. The output ports of inverters 104 and 108 are coupled to the next delay unit in a configuration, such as a multiphase current-controlled ring oscillator, in accordance with the present invention.

In operation, each delay unit 100 provides a propagation delay for pulses that travel from one delay unit to the next. The propagation delay of each delay unit is substantially directly proportional to the capacitance of capacitors 110 and 112. This propagation delay is substantially inversely proportional to the bias current signals provided by current source 102, 114, 116 and 106. Each delay unit provides two output signals that have substantially the same frequency and are approximately 180 degrees out of phase, with respect to each other. The operation of a delay unit is explained in more detail hereinafter, with reference to a signal received from a prior delay unit.

In this context, when the voltage signal across capacitor 110 switches to a voltage signal having an amplitude substantially equal to a power supply voltage signal, $V_{DD}$, capacitor 110 is referred to as having entered its charged state. Likewise, when the voltage signal across capacitor 112 switches to substantially zero volts, capacitor 112 is referred to as having entered its discharged state. Thus, a charged state for a capacitor occurs when the voltage signal across the capacitors reaches a logical "1" level. For the purpose of describing this embodiment, it is assumed that logical "1" is a positive voltage signal with an amplitude equal to power supply voltage signal, $V_{DD}$, although the invention is not limited in scope in this respect. A discharged state for a capacitor occurs when the voltage signal across the capacitor reaches a logical "0" level. For the purpose of describing this embodiment, it is assumed that logical "0" is zero volts, although the invention is not limited in scope in this respect.

Thus, during operation, prior to receiving a signal from a previous delay unit, capacitor 110 may be substantially discharged at a signal voltage level "zero", and capacitor 112 may be substantially charged at signal voltage level, $V_{DD}$. Inverters 104 and 108 receive a differential input signal from a previous delay unit. For example an input signal to inverter 104 may be a logical "0". The input signal to inverter 108 is a logical "1." At the instant when capacitor 110 is substantially fully discharged and capacitor 112 is substantially fully charged, the output signal of inverter 118 may be substantially "1," and the output signal of inverter 120 may be substantially "0."

Because the input signal to inverter 104 is "0", the output signal at the output port of inverter 104 begins rising to signal level "1." Capacitor 110, therefore, begins charging from "0" to $V_{DD}$. Meanwhile, the output signal at the output port of inverter 108 begins falling to signal level "0," and capacitor 112 begins discharging from $V_{DD}$ toward "0." Thus, the input voltage signal to inverter 118 of latch 119 begins increasing from "0" toward $V_{DD}$, and the input voltage signal to inverter 120 of latch 119 begins decreasing from $V_{DD}$ toward "0." When the input voltage signal to inverter 118 reaches an amplitude larger than $V_{DD}/2$ and the input voltage signal to inverter 120 reaches an amplitude smaller than $V_{DD}/2$, inverters 118 and 120 begin to switch their state. The output signal of inverter 118 begins dropping toward "0." Since the output port of inverter 118 is coupled to the input port of inverter 120, the output signal of inverter 120 begins rising toward $V_{DD}$. Because, the output port of inverter 120 is coupled to the input port of inverter 118, the increase of output signal of inverter 120 accelerates the decrease of output signal of inverter 118. Likewise, because the output port of inverter 118 is coupled to the input port of inverter 120, the accelerated decrease of output signal of inverter 118 in turn accelerates the increase of output signal of inverter 120. Thus, inverters 118 and 120 switch their state after a substantially short period of time. Therefore, latch 119, in effect provides a regenerative feedback loop, when the voltage signal across capacitors 110 and 112 reach a given signal level, such as approximately $V_{DD}/2$, although the scope of the invention is not limited in this respect.

The output port of inverter 120 is coupled to capacitor 110. When latch 119 changes its state, capacitor 110 begins charging at an accelerating rate. Conversely, capacitor 112, which is coupled to the output port of inverter 118, begins discharging at an accelerating rate. The regenerative feedback loop functions as a switching accelerator and substantially reduces the time it takes to switch the charged and discharged states for capacitors 110 and 112, as compared to the charging and discharging time of the capacitors. Therefore, the delay in the delay unit will be substantially attributable to charging and discharging time of capacitors 110 and 112. Because the charging and discharging time of the capacitors are the elements that substantially contribute to the delay time in delay unit 100, the configuration described herein, provides a substantially linear frequency/current characteristic for delay unit 100.

Another advantage of a ring oscillator configured in accordance with the present invention is a substantially high Power Supply Rejection Ratio (PSRR). PSRR, as explained in more detail hereinafter, is a measure of the extent to which the AC components of a power supply affect the operation of the amplifier. Typically, the DC supply voltage signal that drives inverters 104 and 108, influences the output voltage at the inverters due to feedthrough of supply voltage fluctuations into the signal path of the inverter. Supply voltage fluctuations may be caused by AC ripple voltage at the output of the DC power supply that uses a rectifier to convert an AC line voltage to a DC voltage followed by a filter circuit. Other types of noise and interferences in the AC line voltage may also cause supply voltage fluctuations. The power supply rejection ratio, PSRR, is defined as the ratio of change in the output voltage signal resulting from a change in the supply voltage to the change in the supply voltage, and is usually expressed in decibels (dB).

The reason that a ring oscillator configured in accordance with the present invention has a high PSRR is described hereinafter. While capacitor 110 is being charged from zero volts to $V_{DD}/2$ and capacitor 112 is being discharged from $V_{DD}$ to $V_{DD}/2$, latch 119 operates as a differential gain stage within a substantially linear region around $V_{DD}/2$. A differential gain stage rejects all common mode signals that are applied to its input ports. Because, an AC ripple fluctuation that is generated by the DC power supply will at least in part be common to both input ports of latch 119, the output of the latch is not being substantially affected by the AC ripple fluctuations. Therefore, the output port of each delay unit configured in accordance with the present invention, receives a substantially attenuated noise from the DC power supply.

Compared to the multivibrator of FIG. 2, the functions of comparison and switching are combined in delay unit 100 by coupling capacitors 110 and 112 to latch 119. In effect, each inverter 118 and 120, operates as a switch, and latch 119, which is formed by inverters 118 and 120 operates as a comparator in relation to capacitors 110 and 112. When the voltage signal at one of the capacitors reaches a certain level, for example, $V_{DD}/2$ in the embodiment described herein, the output signals of inverters 118 and 120 switch their states in a relatively short period of time compared to the charging and discharging times of the capacitors. This relatively speedy transition allows the delay unit to maintain a substantially linear frequency/current characteristic.

Because inverters 104 and 108 are configured to drive inverters 118 and 120, the state of the latch may be switched easily. Furthermore, the output signals of inverters 118 and 120 of latch 119 follow $V_{DD}$ and "0" signals. Therefore, latch 119 is configured so that delay unit 100 provides rail-to-rail output signal levels. The latch also ensures substantially equal rise and fall times for capacitors 110 and 112.

As mentioned before, delay unit 100 may be used in a ring oscillator in accordance with the present invention. In some circumstances, for example during power-up, the ring oscillator may "lock up" in a stable state, so that no oscillation takes place. When such a state is detected, by a frequency detector, for example (not shown), transistors 126 and 128 operate as triggering circuits, and may be activated so that the delay unit becomes unstable again. A bias voltage signal, $V_{ST}$, is applied, so as to activate transistor 126, which "pulls down" the output voltage signal of output port of inverter 104 to "0". A bias voltage signal, $V_{STB}$, activates transistor 128, which in turn "pulls up" the output voltage signal of output port of inverter 112 to $V_{DD}$. Thus, by this technique, a ring oscillator in accordance with the present invention, using a delay unit 100, may enter into a highly unstable state, whenever it is desirable to trigger normal oscillation.

Figure 5:
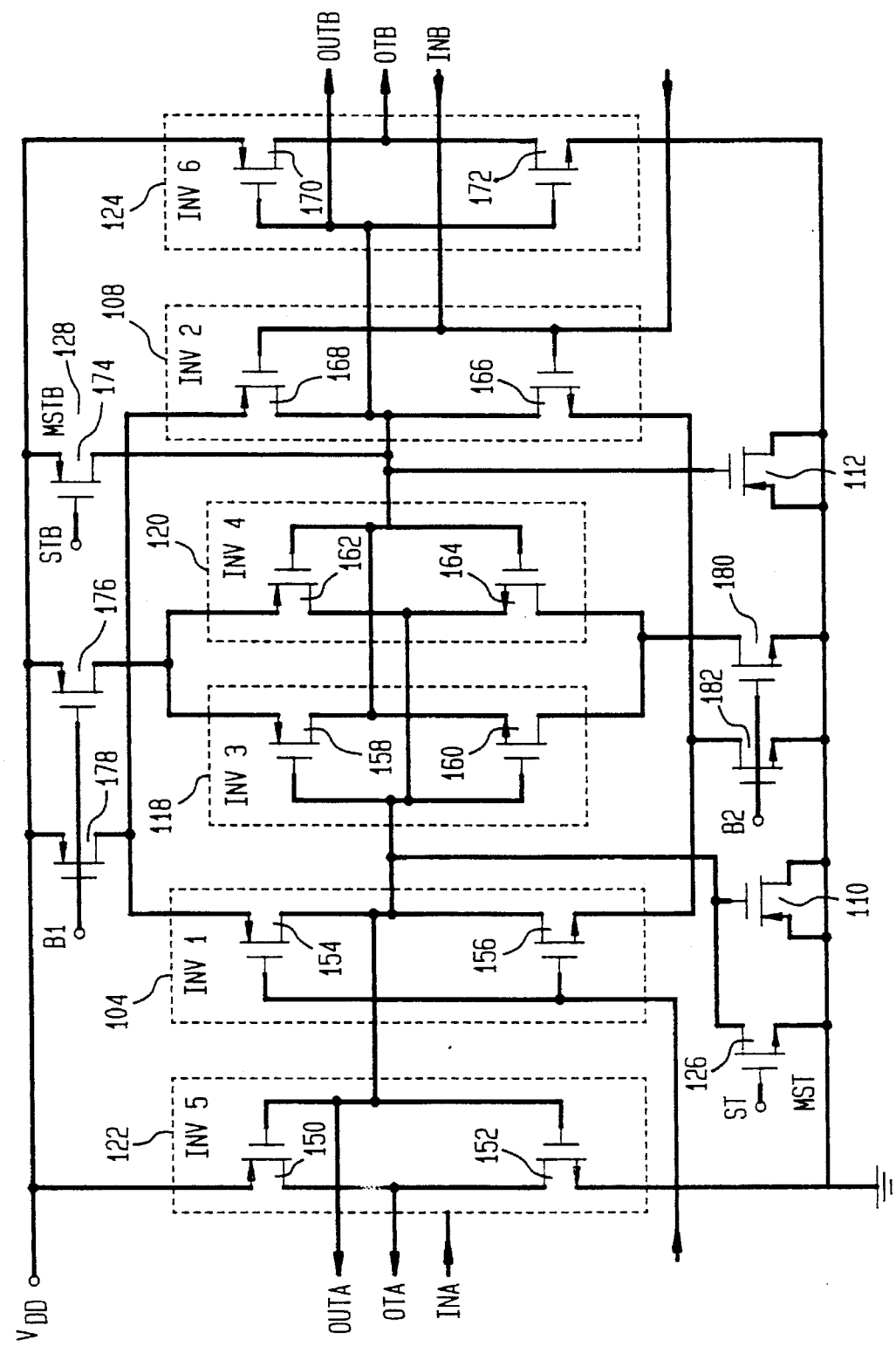
FIG. 5 illustrates a transistor level schematic diagram of the embodiment of a delay unit represented in FIG. 1.

FIG. 5 illustrates a transistor level schematic diagram of the delay unit 100, shown in FIG. 4. The transistors shown in FIG. 5 comprise MOSFET transistors. However, the present invention is not limited in scope to the schematic design illustrated in FIG. 5 and specifically not to MOSFET type transistors. Inverter 104 is formed by two transistors 154 and 156. Similarly, inverter 108 is formed by two transistors 166 and 168. The respective sources of transistors 168 and 154 are coupled together. The respective sources of transistors 156 and 166 are also coupled together. The drain of transistor 154 is coupled to the drain of transistor 156. Similarly, the drain of transistor 166 is coupled to the drain of transistor 168. Thus, inverters 104 and 108 form a differential input stage. Inverters 104 and 108 are coupled to supply voltage signal, $V_{DD}$, through current source transistor 178. The current flow through transistor 178 is controlled, at least in part, by a control current source transistor (not shown) coupled to gate B1 of transistor 178, and configured to form a current mirror with transistor 178. Thus, the current signal provided by the control current source transistor is mirrored in transistor 178. Inverters 104 and 108 are coupled to a ground rail through current source transistor 182. Current source transistor 182 operates as a current sink, providing a discharging path for capacitors 110 and 112, respectively. The current flow through transistor 182 is controlled, at least in part, by a control current source transistor (not shown) coupled to gate B2 of transistor 182, and configured to form a current mirror with transistor 182. Thus, the current signal provided by the control current source transistor is mirrored in transistor 182. In accordance with one embodiment of the invention, the control current source that forms a current mirror with transistors 178 and 182 of FIG. 5, may comprise a voltage-to-current converter, such as described in a concurrently filed patent application Ser. No. 08/509,072, incorporated herein by reference entitled "Voltage-to-Current Converter," (Lakshmikumar 6) by K. Lakshmikumar.

It will be appreciated that current source transistors 178 and 182 provide bias current signals for the operation of inverters 104 and 108 and charging of capacitors 110 and 112, respectively. Likewise, current source transistors 176 and 180 provide bias current signals for the operation of inverters 118 and 120 and charging of capacitors 110 and 112, respectively. An increase or decrease of the control current signals affects the time it takes for capacitors 110 and 112 to charge and discharge, and hence, the delay generated by the delay unit.

The output port of inverter 104 is coupled to the input port of inverter 118. Similarly, the output port of inverter 108 is coupled to the input port of inverter 120. Inverter 118 is formed by two transistors 158 and 160, and inverter 120 is formed by two transistors 162 and 164. The respective sources of transistors 164 and 160 are coupled together. The respective sources of transistors 162 and 158 are also coupled together. The drain of transistor 158 is coupled to the drain of transistor 160. Similarly, the drain of transistor 162 is coupled to the drain of transistor 164. The input port of inverter 120 is coupled to the output port of inverter 118. Similarly, the input port of inverter 118 is coupled to the output port of inverter 120. The input port of inverter 120 is also coupled to the output port of inverter 108. Similarly, the input port of inverter 118 is coupled to the output port of inverter 104. Inverters 118 and 120 are coupled to supply voltage signal, $V_{DD}$, through current source transistor 176. Inverters 118 and 120 are coupled to a ground rail through current source transistor 180. The transistors forming inverters 118 and 120 have an "aspect ratio" that is approximately half as large as the "aspect ratio" of transistors forming inverters 104 and 108. As mentioned previously, "aspect ratio" in this context is defined as the ratio of the width of a transistor over its length. Furthermore, the "aspect ratio" of current source transistors 176 and 180 are smaller than the "aspect ratio" of current source transistors 178 and 182 by a factor of two, approximately. These relative transistor sizes ensure that inverters 104 and 108, are able to drive inverters 118 and 120 and, hence, are capable of inducing inverters 118 and 120 to change states, in the manner previously described. Thus, it will be appreciated that the relative "aspect ratio's" between the transistors may not be a factor of two and other relationships may be acceptable.

Buffer inverters 124 and 122 are respectively formed by transistors 170 and 172 and transistors 150 and 152. The input port of inverter 124 is coupled to terminal OUTB, which in turn is used to couple delay unit 100 to the input stage of the next delay unit in an embodiment of a ring oscillator in accordance with the invention. Similarly, the input port of inverter 122 is connected to terminal OUTA, which in turn is used to couple delay unit 100 to the input stage of the next delay unit in an embodiment of a ring oscillator in accordance with the invention. The output ports of buffer inverters 124 and 122 are respectively coupled to terminals OTB and OTA, which in turn are used to couple the output ports of the delay unit to external circuitry.

Capacitors 112 and 110 are likewise formed by transistors as illustrated in FIG. 5. Transistors 128 and 126 are also shown in FIG. 5. It will be appreciated that the amount of delay in delay unit 100 is related to the capacitance of capacitors 112 and 110 and to the charging current signals generated by transistors 178 and 182.

Figure 6:
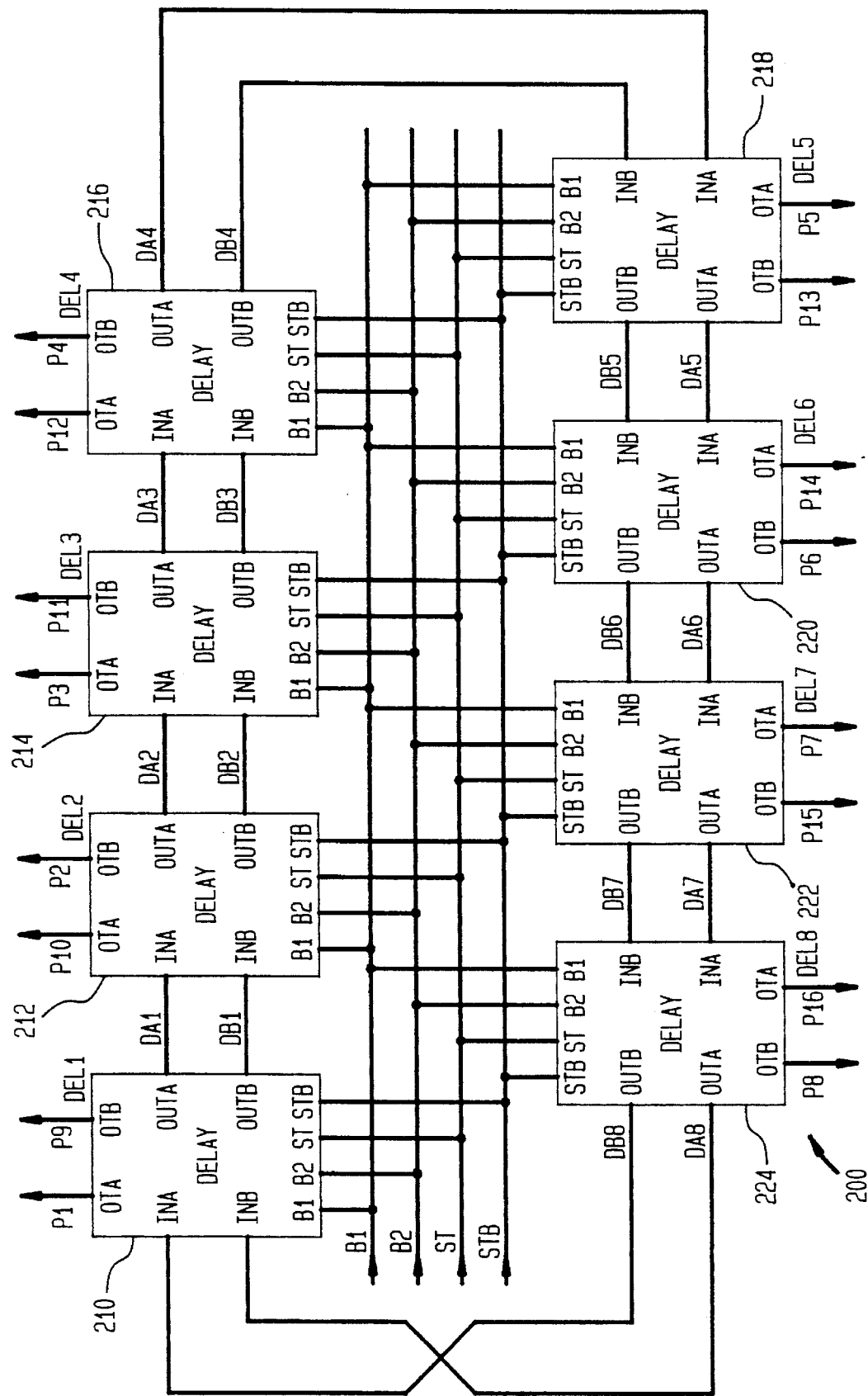
FIG. 6 illustrates an embodiment of a ring oscillator in accordance with the present invention.

FIG. 6 illustrates an embodiment of a ring oscillator 200 in accordance with the present invention. Delay units 210, 212, 214, 216, 218, 220, 222, and 224 are configured to operate in the same way as described above with reference to delay unit 100 and FIGS. 1 and 5. Ring oscillator 200 generates sixteen phase-shifted clock signals having substantially the same frequency at output ports P1 through P16. Current-controlled ring oscillator 200 has a substantially linear frequency/current characteristic. The arrangement of current-controlled ring oscillator 200 in accordance with the invention, may be easily adapted for use as an integrated circuit.

It will be appreciated that with reference to FIG. 8, a ring oscillator in accordance with the invention, such as ring oscillator 200, may be employed in phase-locked loop 260. Thus, phase-locked loop 260 is adapted to generate sixteen phase shifted clock signals at a frequency which is substantially synchronous with the input frequency signal applied to the phase-locked loop.

Figure 7:
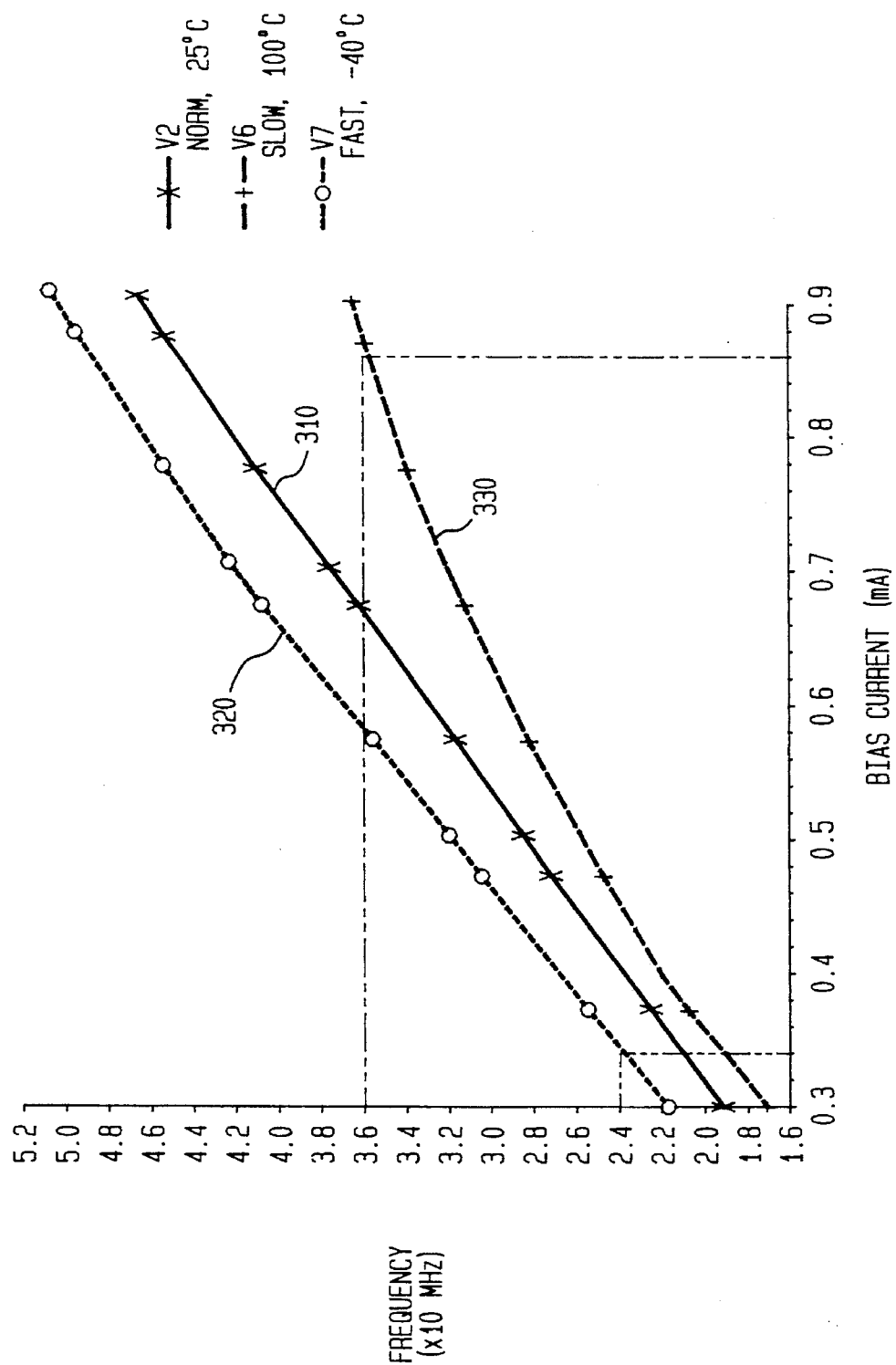
FIG. 7 is a plot illustrating the frequency/current characteristics of the embodiment represented in FIG. 6.

The simulated performance of ring oscillator 200 as a function of the bias current is illustrated in FIG. 7. Typically, the physical characteristics, such as switching delay of the transistors forming ring oscillator 200, fall within various tolerance levels. Those transistors, whose characteristics fall within a predetermined certain range, are referred to as being manufactured under nominal processing conditions. Those transistors, whose characteristics, such as switching delay is longer than nominal, are referred to as being manufactured under slow processing conditions. Conversely, those transistors, whose characteristics, such as switching delay, is shorter than nominal, are referred to as being manufactured under fast processing conditions. Furthermore, these transistor characteristics also vary with the ambient operating temperature. Thus, under substantially high operating temperature, the switching delay of these transistors increases, whereas under substantially low operating temperature, the switching delay of these transistors decreases. Thus a very fast response occurs, when a transistor with fast processing conditions operates under low temperatures. Likewise, a very slow response occurs, when a transistor with slow processing conditions operates under high temperature.

Solid line 310 illustrates the frequency/current characteristic of ring oscillator 200 for nominal processing conditions at room temperature (25° C.). Dotted line 320 illustrates the frequency/current characteristic of ring oscillator 200 for fast processing conditions at −40° C. Finally, dashed line 330 illustrates the frequency/current characteristic of ring oscillator 200 for slow processing conditions at 100° C. These curves cover a wide range of the process and temperature conditions. For the very slow case, the slope of line 330 decreases at high frequencies, indicating that the time taken for comparison and switching by latch 119 has become comparable to the charging and discharging time of capacitors 110 and 112. However, even for this slow process, ring oscillator 200 maintains a substantially linear frequency/current characteristic over more than one frequency octave.

Thus, a ring oscillator in accordance with the present invention provides a plurality of phase shifted frequency signals, that may be varied in response to a current signal. A ring oscillator in accordance with the present invention also provides a substantially linear current/frequency characteristic.

While only certain features of the invention have been illustrated and described herein, many modifications, substitutions, changes or equivalents will now occur to those skilled in the art. It is therefore, to be understood that the appended claims are intended to cover all such modifications and changes as fall within the true spirit of the invention.

I claim:

1. In a ring oscillator, a delay unit comprising:

an input stage having a first and a second input port and a first and a second differential output port;

a first capacitor coupled to said first differential output port of said delay unit and a second capacitor coupled to said second differential output port of said delay unit; and a switching accelerator coupled to said first and second capacitors so as to reduce the time it takes to switch between charged and discharged states for said capacitors, said delay unit being coupled to at least one other substantially similar delay unit so as to form said ring oscillator.

2. A ring oscillator according to claim 1, wherein said input stage of said delay unit further comprises a first and a second inverter.

3. A ring oscillator according to claim 2, wherein said switching accelerator of said delay unit comprises a latch unit coupled in a configuration so as to provide regenerative feed back.

4. A ring oscillator according to claim 3, wherein said latch unit further comprises a first and a second latch inverter, each of said latch inverters having an input terminal and an output terminal, the input terminal of said first latch inverter being coupled to said first differential output port and to said output terminal of said second latch inverter, and the input terminal of said second latch inverter being coupled to said second differential output port and to said output terminal of said first latch inverter.

5. A ring oscillator according to claim 3, further comprising a first and a second output buffer coupled to said first and second differential output ports.

6. A ring oscillator according to claim 4, further comprising a triggering circuit for driving the output signal of each one of said differential output ports to a voltage signal level so as to trigger the oscillation of said oscillator.

7. A ring oscillator according to claim 6, wherein said charged state is a signal level substantially equal to a logical "1", and said discharged state is a signal level substantially equal to a logical "0".

8. An integrated circuit including a delay unit, said delay unit comprising:

a first and a second input inverter forming a first and a second input port and a first and a second output port;

a first capacitor coupled to said first output port and a second capacitor coupled to said second output port; and a switching accelerator coupled to said first and second capacitor so as to reduce the time it takes to switch between charged and discharged states for said first and second capacitors.

9. An integrated circuit according to claim 8, wherein said switching accelerator comprises a regenerative feedback loop.

10. An integrated circuit according to claim 9, wherein said regenerative feedback loop further comprises a latch having a first and a second latch inverter, each latch inverter having an input terminal and an output terminal, the input terminal of said first latch inverter being coupled to said first output port and to said output terminal of said second latch inverter, and the input terminal of said second latch inverter being coupled to said second output port and to said output terminal of first latch inverter.

11. An integrated circuit according to claim 10, wherein said first and second input inverters and said latch inverters further each comprise a n channel transistor and a p channel transistor in a configuration so that the drains of said transistors are coupled together and the gates of said transistors are coupled together.

12. An integrated circuit according to claim 11, wherein the aspect ratio of said transistors of said latch inverters is smaller than the aspect ratio of said transistors of said input inverters.

13. An integrated circuit according to claim 12, wherein said first and second input inverters are adapted to be driven by a first variable control current signal.

14. An integrated circuit according to claim 13, wherein said first and second latch inverters are adapted to be driven by a second variable control current signal.

15. An integrated circuit according to claim 13, wherein said delay unit is coupled to at least one other substantially similar delay unit so as to form a ring oscillator, said ring oscillator having an oscillation frequency that varies as a function of said first variable control current signal.

16. A method for providing a delay in a delay unit, said delay of the delay unit being dependent, at least in part, upon the time to charge and discharge a capacitor coupled in said delay unit, the method comprising the steps of:

providing a current signal to said delay unit in a manner so as to cause said capacitor to enter a charged state from a prior discharged state; and accelerating the switching between said discharged and charged states so as to reduce the time it takes to switch between said discharged and charged states for said capacitor.

17. The method for providing a delay according to claim 16, wherein said step of accelerating further comprises the step of providing regenerative feedback.

18. The method for providing a delay according to claim 17, wherein said step of providing regenerative feedback further comprises the steps of: maintaining a first and a second voltage signal state in a latch; and switching the signal states upon detecting a predetermined voltage at said capacitor.

19. The method for providing a delay according to claim 18, wherein said delay unit is coupled to at least one other substantially similar delay unit so as to form a ring oscillator.

* * * * *